United States Patent
Yang

(10) Patent No.: US 10,872,580 B2
(45) Date of Patent: Dec. 22, 2020

(54) SHIFT REGISTER UNIT AND DRIVING METHOD THEREOF, SCAN DRIVE CIRCUIT AND DISPLAY APPARATUS

(71) Applicant: BOE Technology Group Co., Ltd., Beijing (CN)

(72) Inventor: Chengchung Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/623,036

(22) PCT Filed: Mar. 19, 2019

(86) PCT No.: PCT/CN2019/078764
§ 371 (c)(1),
(2) Date: Dec. 16, 2019

(87) PCT Pub. No.: WO2019/214346
PCT Pub. Date: Nov. 14, 2019

(65) Prior Publication Data
US 2020/0184922 A1    Jun. 11, 2020

(30) Foreign Application Priority Data
May 8, 2018  (CN) .......................... 2018 1 0431399

(51) Int. Cl.
*G09G 5/00*    (2006.01)
*G11C 19/28*    (2006.01)

(52) U.S. Cl.
CPC ............. *G09G 5/006* (2013.01); *G11C 19/28* (2013.01); *G09G 2310/0286* (2013.01); *G09G 2310/061* (2013.01)

(58) Field of Classification Search
CPC .................... G11C 19/28; G09G 5/006; G09G 2310/0286; G09G 2310/061
USPC .......................................................... 345/204
See application file for complete search history.

(56) References Cited

U.S. PATENT DOCUMENTS

| | | | |
|---|---|---|---|
| 2016/0027371 A1* | 1/2016 | Hao | G09G 3/2092 345/214 |
| 2016/0322115 A1* | 11/2016 | Xu | G11C 19/28 |
| 2017/0032752 A1* | 2/2017 | Huang | G11C 19/28 |

* cited by examiner

*Primary Examiner* — Jacinta M Crawford
(74) *Attorney, Agent, or Firm* — Fay Sharpe LLP

(57) ABSTRACT

A shift register unit includes: an input circuit, configured to communicate an input terminal with a first node; an output control circuit, configured to provide a second clock signal for a second node when the first node is at a second level, and provide a first level for the second node when the first clock signal is at the second level; a reset control circuit, configured to provide the first level for the third node when the second clock signal and the first node are both at the second level, and provide the second level for the third node when the first clock signal is at the second level; and an output circuit, configured to provide the second level for an output terminal when the second node is at the second level, and provide the first level for the output terminal when the third node is at the second level.

20 Claims, 12 Drawing Sheets

At a charging stage, an input signal output by an input terminal is at the second level, a first clock signal is at the second level, the input circuit provides an input signal for a first node under control of the first clock signal ~501

At an outputting stage, a second clock signal is at the second level, the first clock signal is at the first level, the first level is provided for the input terminal, the first node is at the second level, an output control circuit provides the second clock signal for the second node under control of the first node, and an output circuit provides the second level from a second level voltage line for an output terminal under control of the second node ~502

At a resetting stage, the first clock signal is at the second level, the second clock signal is at the first level, the first level is provided for the input terminal, the reset control circuit provides the second level from the second level voltage line for a third node under control of the first clock signal, the output circuit provides the first level from the first level voltage line for the output terminal under control of the third node, and the output control circuit provides the first level from the first level voltage line for the second node under control of the first clock signal ~503

FIG. 5

SHIFT REGISTER UNIT AND DRIVING METHOD THEREOF, SCAN DRIVE CIRCUIT AND DISPLAY APPARATUS

The present application is a 371 of PCT Application No.: PCT/CN2019/078764 filed on Mar. 19, 2019, which claims priority to Chinese Patent Application No. 201810431399.7 filed on May 8, 2018 and entitled "SHIFT REGISTER UNIT AND DRIVING METHOD THEREOF, SCAN DRIVE CIRCUIT AND DISPLAY APPARATUS", the entire contents of which are incorporated herein by reference.

SUMMARY

The present disclosure relates to the field of display, and particularly to a shift register unit and a driving method thereof, a scan drive circuit and a display apparatus.

BACKGROUND

With the gate driver on array (GOA) technology, a scan drive circuit may be directly fabricated on an array substrate, such that a circuit board for carrying the scan drive circuit may be omitted, and symmetric design of frames on both sides of a display panel may be implemented. In addition, regions for binding chips and wiring regions (for example, fan-out regions) on the edge of the display panel may be reduced, which facilitates implementation of narrow-frame design. In addition, with the rapid development of the display technologies, the market imposes higher requirements on aesthetics of display products. While, narrow frame is an important measure to improve the aesthetics of display products. Therefore, further narrowing the frame becomes an important demand for the display products.

The scan drive circuit is also referred to as a gate drive circuit or a GOA circuit, and includes a plurality of cascaded GOA units. The GOA unit may also be referred to as a shift register unit.

SUMMARY

The present disclosure provides a shift register unit and a driving method thereof, a scan drive circuit and a display apparatus.

In an aspect, the present disclosure provides a shift register unit. The shift register unit comprises an input terminal and an output terminal, and further comprising: an input circuit, an output control circuit, a reset control circuit and an output circuit; wherein the input circuit is connected to a first clock signal terminal, the input terminal and a first node, and configured to provide an input signal from the input terminal for the first node when a first clock signal from the first clock signal terminal is at a second level;

the output control circuit is connected to the first clock signal terminal, a second clock signal terminal, a first level voltage line, the first node and a second node, and configured to provide a second clock signal from the second clock signal terminal for the second node when the first node is at the second level, and provide a first level from the first level voltage line for the second node when the first clock signal is at the second level;

the reset control circuit is connected to the first clock signal terminal, the second clock signal terminal, the first level voltage line, a second level voltage line, the first node and a third node, and configured to provide the first level from the first level voltage line for the third node when the second clock signal and the first node are both at the second level, and provide a second level from the second level voltage line for the third node when the first clock signal is at the second level; and the output circuit is connected to the first level voltage line, the second level voltage line, the second node, the third node and the output terminal, and configured to provide the second level from the second level voltage line for the output terminal when the second node is at the second level, and provide the first level from the first level voltage line for the output terminal when the third node is at the second level.

In a possible implementation, the output control circuit comprises: a first output control sub-circuit and a second output control sub-circuit; wherein the first output control sub-circuit is connected to the first node, the second clock signal terminal and the second node, and configured to provide the second clock signal for the second node when the first node is at the second level; and the second output control sub-circuit is connected to the first clock signal terminal, the first level voltage line and the second node, and configured to provide the first level from the first level voltage line for the second node when the first clock signal is at the second level.

In a possible implementation, the first output control sub-circuit comprises a first transistor; and the second output control sub-circuit comprises a second transistor; wherein a gate of the first transistor is connected to the first node, one of a source and a drain of the first transistor is connected to the second clock signal terminal, and the other of the source and the drain of the first transistor is connected to the second node; and a gate of the second transistor is connected to the first clock signal terminal, one of a source and a drain of the second transistor is connected to the first level voltage line, and the other of the source and the drain of the second transistor is connected to the second node.

In a possible implementation, the reset control circuit comprises: a first reset control sub-circuit and a second reset control sub-circuit; wherein the first reset control sub-circuit is connected to the first node, the second clock signal terminal, the first level voltage line and the third node, and configured to provide the first level from the first level voltage line for the third node when the second clock signal and the first node are both at the second level; and the second reset control sub-circuit is connected to the first clock signal terminal, the second level voltage line and the third node, and configured to provide the second level from the second level voltage line for the third node when the first clock signal is at the second level.

In a possible implementation, the first reset control sub-circuit comprises a third transistor and a fourth transistor; and the second reset control sub-circuit comprises a fifth transistor; wherein a gate of the third transistor is connected to the second clock signal terminal, one of a source and a drain of the third transistor is connected to the first level voltage line, and the other of the source and the drain of the third transistor is connected to a source or a drain of the fourth transistor;

a gate of the fourth transistor is connected to the first node, one of the source and the drain of the fourth transistor that is not connected to the third transistor is connected to the third node; and a gate of the fifth transistor is connected to the first clock signal terminal, one of a source and a drain of the fifth transistor is connected to the second level voltage line, and the other of the source and the drain of the fifth transistor is connected to the third node.

In a possible implementation, the output circuit comprises: a first output sub-circuit and a second output sub-circuit; wherein the first output sub-circuit is connected to the second node, the second level voltage line and the output terminal, and configured to provide the second level from the second level voltage line for the output terminal when the second node is at the second level; and the second output sub-circuit is connected to the third node, the first level voltage line and the output terminal, and configured to provide the first level from the first level voltage line for the output terminal when the third node is at the second level.

In a possible implementation, the first output sub-circuit comprises a sixth transistor; and the second output sub-circuit comprises a seventh transistor; wherein a gate of the sixth transistor is connected to the second node, one of a source and a drain of the sixth transistor is connected to the output terminal, and the other of the source and the drain of the sixth transistor is connected to the second level voltage line; and a gate of the seventh transistor is connected to the third node, one of a source and a drain of the seventh transistor is connected to the first level voltage line, and the other of the source and the drain of the seventh transistor is connected to the output terminal.

In a possible implementation, the first output sub-circuit further comprises: a first capacitor; wherein a first terminal of the first capacitor is connected to the second node, and a second terminal of the first capacitor is connected to the output terminal.

In a possible implementation, the second output sub-circuit further comprises: a second capacitor; wherein a first terminal of the second capacitor is connected to the third node, and a second terminal of the second capacitor is connected to the first level voltage line.

In a possible implementation, the input circuit comprises: an eighth transistor;

wherein a gate of the eighth transistor is connected to the first clock signal terminal, one of a source and a drain of the eighth transistor is connected to the input terminal, and the other of the source and the drain of the eighth transistor is connected to the first node.

In a possible implementation, the output control circuit comprises a first transistor and a second transistor; the reset control circuit comprises a third transistor, a fourth transistor and a fifth transistor; the output circuit comprises a sixth transistor and a seventh transistor; and the input circuit comprises an eighth transistor; wherein a gate of the first transistor is connected to the first node, one of a source and a drain of the first transistor is connected to the second clock signal terminal, and the other of the source and the drain of the first transistor is connected to the second node;

a gate of the second transistor is connected to the first clock signal terminal, one of a source and a drain of the second transistor is connected to the first level voltage line, and the other of the source and the drain of the second transistor is connected to the second node;

a gate of the third transistor is connected to the second clock signal terminal, one of a source and a drain of the third transistor is connected to the first level voltage line, and the other of the source and the drain of the third transistor is connected to a source or a drain of the fourth transistor;

a gate of the fourth transistor is connected to the first node, one of the source and the drain of the fourth transistor is connected to the source or the drain of the third transistor, and the other of the source and the drain of the fourth transistor is connected to the third node;

a gate of the fifth transistor is connected to the first clock signal terminal, one of a source and a drain of the fifth transistor is connected to the second level voltage line, and the other of the source and the drain of the fifth transistor is connected to the third node;

a gate of the sixth transistor is connected to the second node, one of a source and a drain of the sixth transistor is connected to the output terminal, and the other of the source and the drain of the sixth transistor is connected to the second level voltage line;

a gate of the seventh transistor is connected to the third node, one of a source and a drain of the seventh transistor is connected to the first level voltage line, and the other of the source and the drain of the seventh transistor is connected to the output terminal; and a gate of the eighth transistor is connected to the first clock signal terminal, one of a source and a drain of the eighth transistor is connected to the input terminal, and the other of the source and the drain of the eighth transistor is connected to the first node.

In a possible implementation, the output circuit further comprises: a first capacitor and a second capacitor; wherein a first terminal of the first capacitor is connected to the second node, and a second terminal of the first capacitor is connected to the output terminal; and a first terminal of the second capacitor is connected to the third node, and a second terminal of the second capacitor is connected to the first level voltage line.

In a possible implementation, the second level is lower than the first level, and transistors in the shift register unit are all P-type metal-oxide semiconductor field-effect transistors based on low-temperature polycrystalline silicon.

In another aspect, the present disclosure provides a scan drive circuit. The scan drive circuit comprises at least one shift register unit. The shift register unit comprises an input terminal and an output terminal, and further comprises an input circuit, an output control circuit, a reset control circuit and an output circuit; wherein the input circuit is connected to a first clock signal terminal, the input terminal and a first node, and configured to provide an input signal from the input terminal for the first node when a first clock signal from the first clock signal terminal is at a second level;

the output control circuit is connected to the first clock signal terminal, a second clock signal terminal, a first level voltage line, the first node and a second node, and configured to provide a second clock signal from the second clock signal terminal for the second node when the first node is at the second level, and provide a first level from the first level voltage line for the second node when the first clock signal is at the second level;

the reset control circuit is connected to the first clock signal terminal, the second clock signal terminal, the first level voltage line, a second level voltage line, the first node and a third node, and configured to provide the first level from the first level voltage line for the third node when the second clock signal and the first node are both at the second level, and provide a second level from the second level voltage line for the third node when the first clock signal is at the second level; and the output circuit is connected to the first level voltage line, the second level voltage line, the second node, the third node and the output terminal, and configured to provide the second level from the second level voltage line for the output terminal when the second node is at the second level, and provide the first level from the first level voltage line for the output terminal when the third node is at the second level.

In yet another aspect, the present disclosure provides a display apparatus. The display apparatus comprises any of the scan drive circuits described above.

In still yet another aspect, the present disclosure provides a method for driving a shift register unit. The method is for driving a shift register unit. The method comprises:

at a charging stage, during which a first clock signal is at a second level, a second clock signal is at a first level, providing the second level for an input terminal of the shift register unit. The shift register unit comprises an input terminal and an output terminal, and further comprises an input circuit, an output control circuit, a reset control circuit and an output circuit; wherein the input circuit is connected to a first clock signal terminal, the input terminal and a first node, and configured to provide an input signal from the input terminal for the first node when a first clock signal from the first clock signal terminal is at a second level;

the output control circuit is connected to the first clock signal terminal, a second clock signal terminal, a first level voltage line, the first node and a second node, and configured to provide a second clock signal from the second clock signal terminal for the second node when the first node is at the second level, and provide a first level from the first level voltage line for the second node when the first clock signal is at the second level;

the reset control circuit is connected to the first clock signal terminal, the second clock signal terminal, the first level voltage line, a second level voltage line, the first node and a third node, and configured to provide the first level from the first level voltage line for the third node when the second clock signal and the first node are both at the second level, and provide a second level from the second level voltage line for the third node when the first clock signal is at the second level; and the output circuit is connected to the first level voltage line, the second level voltage line, the second node, the third node and the output terminal, and configured to provide the second level from the second level voltage line for the output terminal when the second node is at the second level, and provide the first level from the first level voltage line for the output terminal when the third node is at the second level.

In a possible implementation, at the charging stage, an input circuit provides an input signal for a first node under control of the first clock signal.

In a possible implementation, after the charging stage, the method further comprises:

at an outputting stage, during which the second clock signal is at the second level and the first clock signal is at the first level, providing the first level for the input terminal, the first node is at the second level, providing, by an output control circuit, the second clock signal for the second node under control of the first node, and providing, by an output circuit, the second level from a second level voltage line for an output terminal under control of the second node; and at a resetting stage, during which the first clock signal is at the second level and the second clock signal is at the first level, providing the first level for the input terminal, providing, by a reset control circuit, the second level from the second level voltage line for a third node under control of the first clock signal, providing, by the output circuit, the first level from a first level voltage line for the output terminal under control of the third node, and providing, by the output control circuit, the first level from the first level voltage line for the second node under control of the first clock signal.

In a possible implementation, at the outputting stage, the reset control circuit provides the first level from the first level voltage line for the third node under control of the second clock signal and the first node.

In a possible implementation, prior to the charging stage, the method further comprises:

at a noise-reduction stage, during which the first clock signal and the second clock signal are subjected to level inversion according to an identical clock cycle, providing the first level for the input terminal, wherein the first node remains at the first level, the second node remains at the first level, and the third node remains at the second level, and providing, by the output circuit, the first level from the first level voltage line for the output terminal under control of the third node.

BRIEF DESCRIPTION OF THE DRAWINGS

In order to describe the technical solutions in the embodiments of the present disclosure more clearly, the accompanying drawings required for describing the embodiments are introduced briefly as follows. Apparently, the accompanying drawings in the following description show merely some embodiments of the present disclosure, and reasonable variations of these drawings shall also be included in the protection scope of the present disclosure.

FIG. 5 is a flowchart of a method for driving a shift register unit according to embodiments of the present disclosure;

DETAILED DESCRIPTION

In the present disclosure, such words as "first", "second" and the like used in this specification are only intended to differentiate different parts, instead of implying any sequence, number or importance. Such words as "include", "comprise" and the like indicate that the elements or item before the word covers listed elements or units or the like that follow the word, but such words do not exclude other elements or items. Such words "connect", "couple" and the derivations thereof are not intended to limit a physical or mechanical connection, but may include an electrical connection, in a direct fashion or an indirect fashion.

In addition, the switch transistors employed in the embodiments of the present disclosure may include P-type switch transistors and N-type switch transistors. The P-type switch transistor is turned on when a gate of the P-type switch transistor is at a low level, and is turned off when the gate of the P-type switch transistor is at a high level; and the N-type switch transistor is turned on when a gate of the N-type switch transistor is at a high level, and is turned off when the gate of the N-type switch transistor is at a low level. In addition, in the various embodiments of the present disclosure, signals correspondingly have a first level and a second level. The first level and the second level only indicate that the signal has two different state quantities, instead of indicating that the first level or the second level in this specification has a specific value.

In addition, the second level and the first level herein may be two different voltage ranges that are pre-configured, and the voltage range of the second level and the voltage range of the first level both use a common-terminal voltage as a reference voltage. In an example, the second levels at all the circuit nodes may be high levels. In another example, the second levels of all the circuit nodes may be low levels. In still another example, the second level at an input terminal Gn-1 may be a low level, whereas the second level at a first node P1 and a second node P2 may be a high level. Nevertheless, settings of the second level and the first level are not limited to the above examples.

In the embodiments of the present disclosure, description is given using the scenario where the first level is a high level relative to the second level as an example.

As known by the inventors, with continuous simplifications of the internal circuit structure of the gate drive circuit, it is hard to further reduce the number of thin film transistors (TFTs) in each GOA unit on the premise of satisfying the application requirements. Thus, it's hard to further reduce the space occupied by each GOA unit, which hinders further narrowing of the frame.

Figure 1:
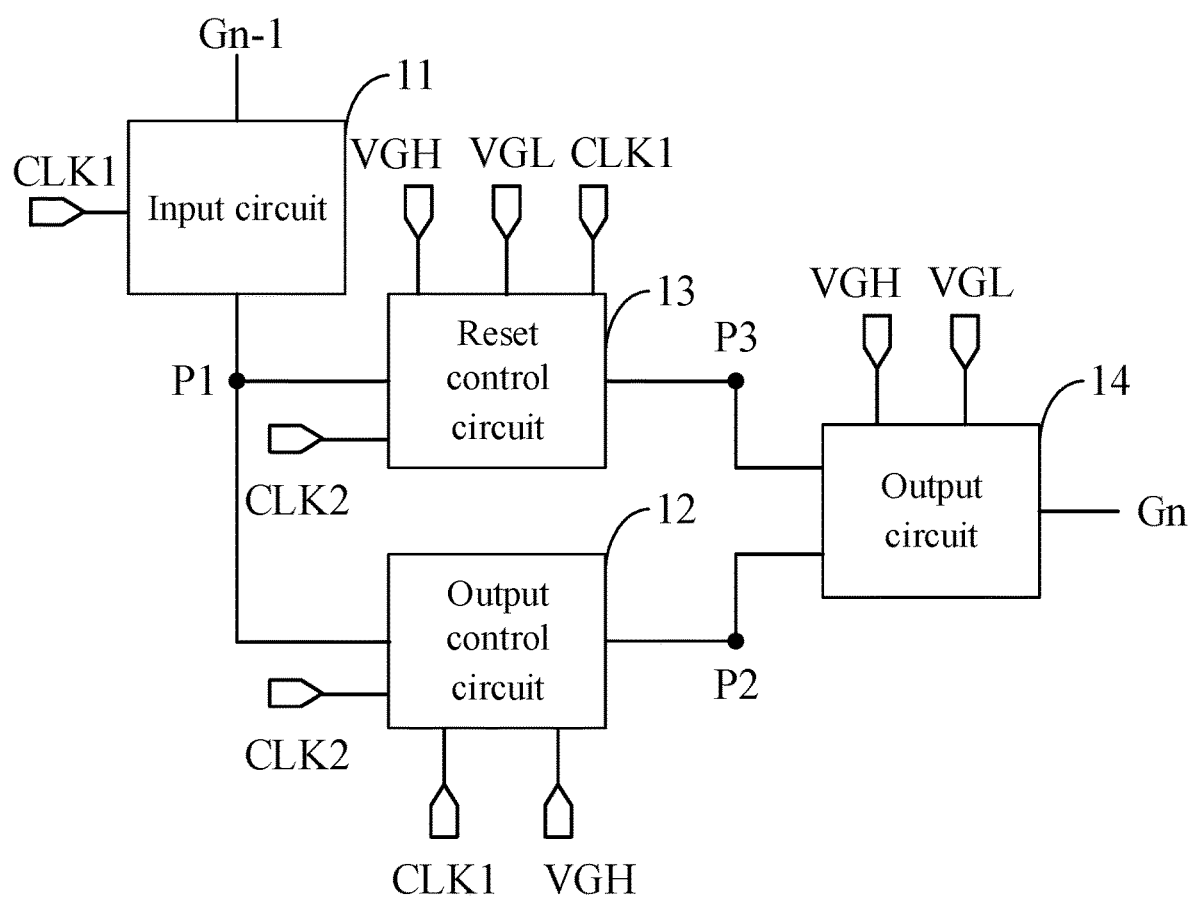
FIG. 1 is a structural block diagram of a shift register unit according to embodiments of the present disclosure.

FIG. 1 is a structural block diagram of a shift register unit according to embodiments of the present disclosure. As illustrated in FIG. 1, the shift register unit includes an input terminal Gn-1 and an output terminal Gn, and the shift register unit further includes: an input circuit 11, an output control circuit 12, a reset control circuit 13 and an output circuit 14.

The input circuit 11 is connected to a first clock signal terminal CLK1, the input terminal Gn-1 and a first node P1. The input circuit 11 is configured to turn on the input terminal Gn-1 and the first node P1 when a first clock signal from the first clock signal terminal CLK1 is at a second level, that is, the input circuit 11 provides an input signal from the input terminal Gn-1 for the first node P1.

The output control circuit 12 is connected to the first clock signal terminal CLK1, a second clock signal terminal CLK2, a first level voltage line VGH, the first node P1 and the second node P2. The output control circuit 12 is configured to provide a second clock signal from the second clock signal terminal CLK2 for the second node P2 when the first node P1 is at the second level, and provide a first level from the first level voltage line VGH for the second node P2 when the first clock signal is at the second level.

The reset control circuit 13 is connected to the first clock signal terminal CLK1, the second clock signal terminal CLK2, the first level voltage line VGH, a second level voltage line VGL, the first node P1 and a third node P3. The reset control circuit 13 is configured to provide a first level from the first level voltage line for the third node P3 when the second clock signal and the first node P1 are both at the second level, and provide a second level from the second level voltage line VHL for the third node P3 when the first clock signal is at the second level.

The output circuit 14 is connected to the first level voltage line VGH, the second level voltage line VGL, the second node P2, the third node P3 and the output terminal Gn. The output circuit 14 is configured to provide the second level from the second level voltage line for the output terminal Gn when the second node P2 is at the second level, and provide the first level from the first level voltage line for the output terminal Gn when the third node P3 is at the second level.

When the first clock signal is at the second level, the second clock signal may be at the first level; and when the second clock signal is at the second level, the first clock signal may be at the first level. For example, the first clock signal and the second clock signal may be signals of which the levels are complementary.

In an example, a driving method employed by the shift register unit may include: providing the second level for the input terminal Gn-1 when the first clock signal is at the second level and the second clock signal is at the first level. In this case, the shift register unit starts entering a charging stage at which the second node P2 is charged. At the charging stage, the first node P1 may be shifted to the second level under the effect of the input circuit 11, and the second node P2 may be shifted to the first level under the effect of the output control circuit 12, the third node P3 may be shifted to the second level under the effect of the reset control circuit 13, and the output terminal Gn may be shifted to the first level under the effect of the output circuit 14.

After the charging stage, the shift register unit may enter an outputting stage. At the outputting stage, the first clock signal is at the first level, and the second clock signal is at the second level; and when the first node P1 remains at the second level, the second node P2 is shifted to the second level under the effect of the output control circuit 12, the third node P3 is shifted to the first level under the effect of the reset control circuit 13, and the output terminal Gn is shifted to the second level under the effect of the output circuit 14. In this case, the output terminal Gn is capable of outputting a drive signal for driving pixel units in a display panel.

After the outputting stage, the shift register unit may enter a resetting stage. At the resetting stage, the first clock signal is at the second level, and the second clock signal is at the first level. The first level is provided for the input terminal Gn-1, the first node P1 may shifted to the first level under the effect of the input circuit 11, the second node P2 may be shifted to the first level under the effect of the output control circuit 12, the third node P3 may be shifted to the second level under the effect of the reset control circuit 13, and the output terminal Gn may be shifted to the first level under the effect of the output circuit 14, that is, the second node P2 and the output terminal Gn are reset during the resetting stage.

It can be known that, in combination with the above driving method, with the level inversion of the first clock signal and the second clock signal, the output terminal Gn of the shift register unit may experience an output process of "the first level—the second level—the first level". That is, the output function of the shift register unit is implemented.

Therefore, the shift register unit is capable of implementing gate driving as a GOA unit circuit.

As seen from the above, the shift register unit according to the embodiment of the present disclosure has a simple structure, which helps reduce the space occupied the shift register unit and thus narrows the frame.

Figure 2:
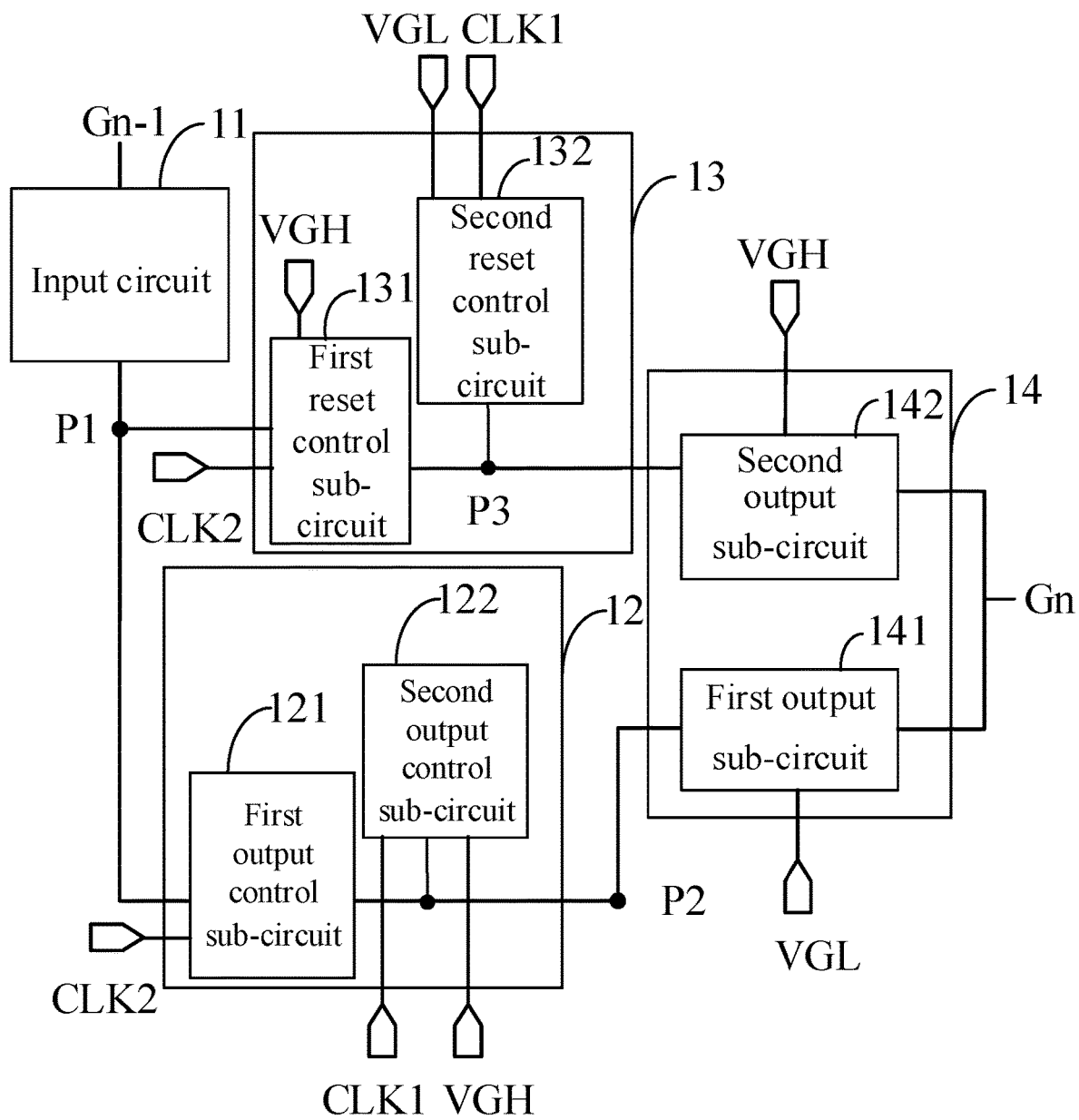
FIG. 2 is a structural block diagram of another shift register unit according to embodiments of the present disclosure.

FIG. 2 is a structural block diagram of another shift register unit according to embodiments of the present disclosure. As illustrated in FIG. 2, the output control circuit 12 may include: a first output control sub-circuit 121 and a second output control sub-circuit 122.

The first output control sub-circuit 121 is connected to the first node P1, the second clock signal terminal CLK2 and the second node P2, and is configured to provide the second clock signal for the second node P2 when the first node P1 is at the second level.

The second output control sub-circuit 122 is connected to the first clock signal terminal CLK1, the first level voltage line VGH and the second node P2, and is configured to provide the first level from the first level voltage line VGH for the second node P2 when the first clock signal is at the second level.

Figure 3:
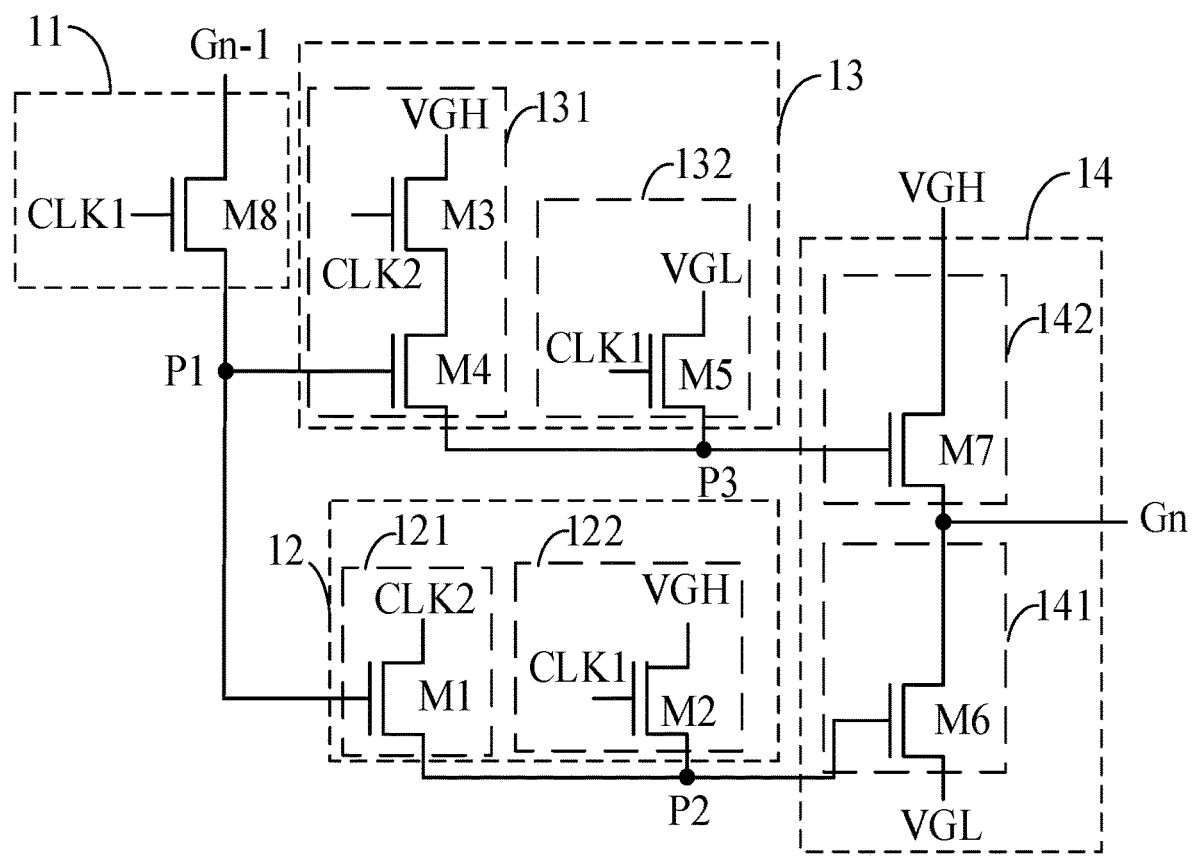
FIG. 3 is a structural circuit diagram of a shift register unit according to embodiments of the present disclosure.

FIG. 3 is a structural circuit diagram of a shift register unit according to embodiments of the present disclosure. As illustrated in FIG. 3, the first output control sub-circuit 121 may include a first transistor M1, and the second output control sub-circuit 122 may include a second transistor M2.

A gate of the first transistor M1 is connected to the first node P1, one of a source and a drain of the first transistor M1 is connected to the second clock signal terminal CLK2, and the other of the source and the drain of the first transistor M1 is connected to the second node P2. A gate of the second transistor M2 is connected to the first clock signal terminal CLK1, one of a source and a drain of the second transistor M2 is connected to the first level voltage line VGH, and the other of the source and the drain of the second transistor M2 is connected to the second node P2.

It should be noted that according to the type of the transistor, a connection relationship may be configured for the source and the drain of the transistor respectively, such that the connection relationship matches the direction of a current flowing through the transistor. In addition, when the transistor has a source-drain symmetric structure, the source and the drain may be considered as two electrodes that are not particularly distinguished.

In the embodiments of the present disclosure, implementation of the present disclosure is described using the scenario where all the transistors are P-type transistors, the second levels of all the circuit nodes and signals are a low level, and the first level is a high level as an example. It should be understood that the technical solution in the present disclosure is not limited to such implementation.

As illustrated in FIG. 2, the reset control circuit 13 may include a first reset control sub-circuit 131 and a second reset control sub-circuit 132.

The first reset control sub-circuit 131 is connected to the first node P1, the second clock signal terminal CLK2, the first level voltage line VGH and the third node P3, and is configured to provide the first level from the first level voltage line VGH for the third node P3 when the second clock signal and the first node P1 are both at the second level.

The second reset control sub-circuit 132 is connected to the first clock signal terminal CLK1, the second level voltage line VGL and the third node P3, and is configured to provide the second level from second level voltage line VGL for the third node P3 when the first clock signal is at the second level.

As illustrated in FIG. 3, the first reset control sub-circuit 131 may include a third transistor M3 and a fourth transistor M4, and the second reset control sub-circuit 132 may include a fifth transistor M5.

A gate of the third transistor M3 is connected to the second clock signal terminal CLK2, one of a source and a drain of the third transistor M3 is connected to the first level voltage line VGH, and the other of the source and the drain of the third transistor M3 is connected to a source or a drain of the fourth transistor M4. A gate of the fourth transistor M4 is connected to the first node P1, and the other of the source and the drain of the fourth transistor M4 that is not connected to the third transistor M4 is connected to the third node P3. A gate of the fifth transistor M5 is connected to the first clock signal terminal CLK1, one of a source and a drain of the fifth transistor M5 is connected to the second level voltage line VGL, and the other of the source and the drain of the fifth transistor M5 is connected to the third node P3.

As illustrated in FIG. 2, the output circuit 14 may include a first output sub-circuit 141 and a second output sub-circuit 142.

The first output sub-circuit 141 is connected to the second node P2, the second level voltage line VGL and the output terminal Gn, and is configured to provide the second level second level voltage line VGL for the output terminal Gn when the second node P2 is at the second level.

The second output sub-circuit 142 is connected to the third node P3, the first level voltage line VGH and the output terminal Gn, and is configured to provide the first level the first level voltage line VGH for the output terminal Gn when the third node P3 is at the second level.

As illustrated in FIG. 3, the first output sub-circuit 141 may include a sixth transistor M6, and the second output sub-circuit 142 may include a seventh transistor M7.

A gate of the sixth transistor M6 is connected to the second node P2, one of a source and a drain of the sixth transistor M6 is connected to the output terminal Gn, and the other of the source and the drain of the sixth transistor M6 is connected to the second level voltage line VGL. A gate of the seventh transistor M7 is connected to the third node P3, one of a source and a drain of the seventh transistor M7 is connected to the first level voltage line VGH, and the other of the source and the drain of the seventh transistor M7 is connected to the output terminal Gn.

Figure 4:
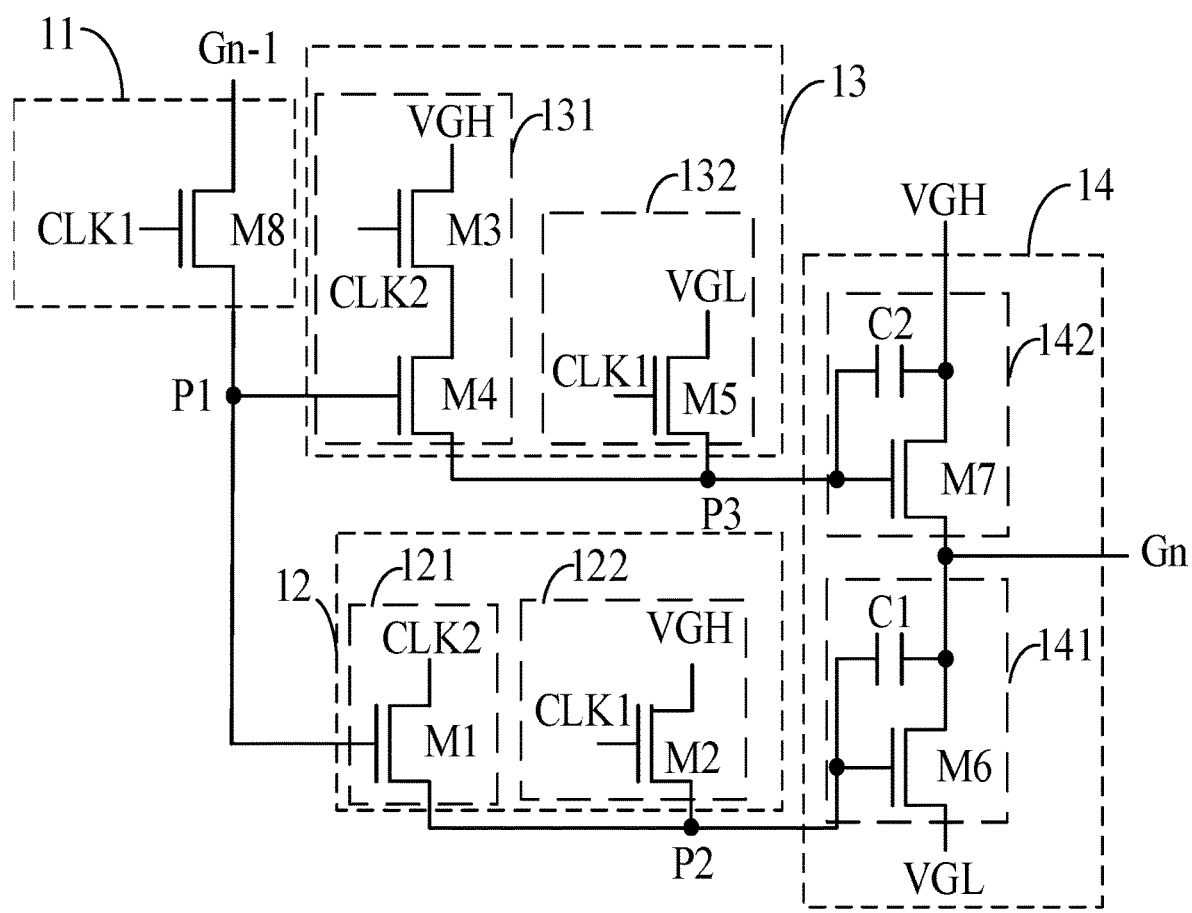
FIG. 4 is a structural circuit diagram of another shift register unit according to embodiments of the present disclosure.

Optionally, as illustrated in FIG. 4, the first output sub-circuit 141 may include a first capacitor C1. A first terminal of the first capacitor C1 is connected to the second node P2, and a second terminal of the first capacitor C1 is connected to the output terminal Gn.

As illustrated in FIG. 4, the second output sub-circuit 142 may further include a second capacitor C2. A first terminal of the second capacitor C2 is connected to the third node P3, and a second terminal of the second capacitor C2 is connected to the first level voltage line VGH.

It should be understood that the first capacitor C1 and the second capacitor C2 are neither necessary for implementing the shifter register function, and the shift register unit may also include one of the first capacitor C1 and the second capacitor C2 implementing the function of the shift register unit.

As illustrated in FIG. 3 and FIG. 4, the input circuit 11 may include an eighth transistor M8. A gate of the eighth transistor M8 is connected to the first clock signal terminal CLK1, one of a source and a drain of the eighth transistor M8 is connected to the input terminal Gn-1, and the other of the source and the drain of the eight transistor M8 is connected to the first node P1.

As seen from the above, the function of the input circuit 11 may be implemented by one transistor, the function of the output control circuit 12 may be implemented by two transistors, the function of the reset control circuit 13 may be implemented by three transistors, and the function of the output circuit 14 may be implemented by two transistors. Therefore, in the shift register unit according to the embodiments of the present disclosure, the function of the shift register unit may be implemented by eight transistors. This helps reduce the number of transistors needed by the gate drive circuit, reduce the space occupied by the GOA units, and thus narrow the frame.

In an example, the transistors in the shift register unit may be all P-type metal oxide semiconductor field effect transistors (PMOSFETs) based on the low temperature poly-silicon (LTPS) technology. For example, the eight transistors in FIG. 3 or FIG. 4 may be all implemented by this type of device. In this way, in addition to implementing the corresponding circuit function by the circuit structure as illustrated in FIG. 3 or FIG. 4, all the transistors in each shift register unit may be fabricated at one time by the same fabrication process, which facilitates simplification of the fabrication process.

Embodiments of the present disclosure provide a method for driving a shift register unit. The method is employed to drive the shift register unit according to the embodiments of the present disclosure. The method may include: providing the second level for an input terminal of the shift register unit at a charging stage during which a first clock signal is at a second level and a second clock signal is at a first level.

By providing the second level for the input terminal of the shift register unit, the shift register unit may be enabled to enter an operating state. At the charging stage, the input circuit may provide an input signal from an input terminal for a first node under control of the first clock signal.

Exemplarily, FIG. 5 is a flowchart of another method for driving a shift register unit according to embodiments of the present disclosure. As illustrated in FIG. 5, the method may include the following steps.

In step 501, at a charging stage, an input signal from an input terminal is at the second level, a first clock signal is at the second level, the input circuit provides an input signal for a first node under control of the first clock signal.

In step 502, at an outputting stage, a second clock signal is at the second level, the first clock signal is at the first level, the input signal from the input terminal is at the first level, the first node is at the second level, an output control circuit provides the second clock signal for the second node under control of the first node, and an output circuit provides the second level from a second level voltage line for an output terminal under control of the second node.

Optionally, the method may further include: providing, by the reset control circuit, the first level from the first level voltage line for the third node under control of the second clock signal and the first node at the outputting stage.

In step 503, at a resetting stage, the first clock signal is at the second level, the second clock signal is at the first level, the input signal from the input terminal is at the first level, the reset control circuit provides the second level from the second level voltage line for a third node under control of the first clock signal, the output circuit provides the first level from the first level voltage line for the output terminal under control of the third node, and the output control circuit provides the first level from the first level voltage line for the second node under control of the first clock signal.

Optionally, after the resetting stage, the method may further include: a noise reduction stage. At the noise reduction stage, the input signal from the input terminal is at the first level, and the first clock signal CK1 and the second clock signal CK2 are subjected to level inversion according to the same clock cycle, until the input signal is shifted again to be at the second level (that is, entering a next inputting stage). At the noise-reduction stage, the first node remains at the first level, the second node remains at the first level, the third node remains at the second level, and the output circuit provides the first level from the first level voltage line for the output terminal under control of the third node.

In addition, during the driving process of the shift register unit, the second clock signal is at the first level when the first clock signal is at the second level, and the first clock signal is at the first level when the second clock signal is at the second level.

Figure 6:
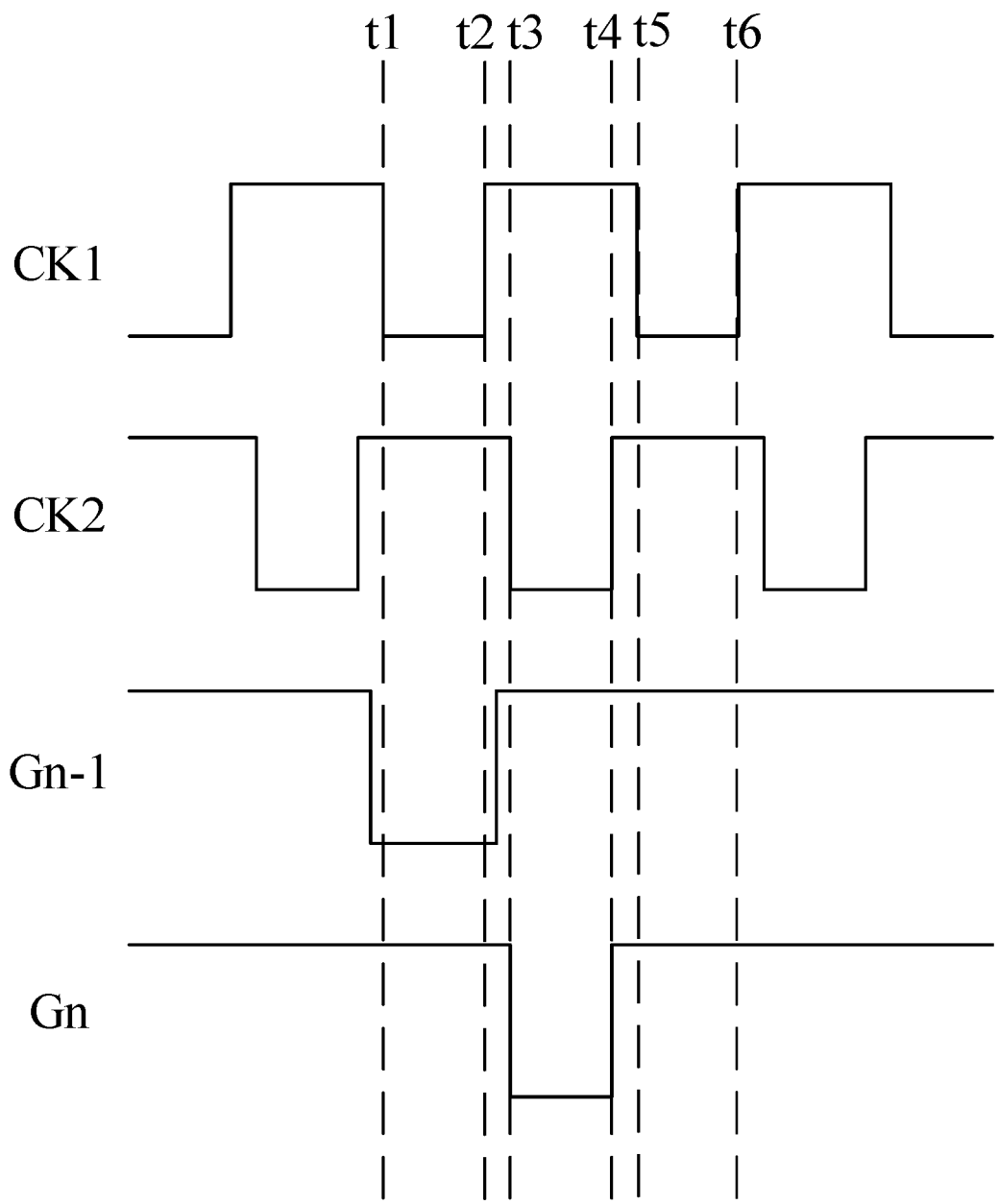
FIG. 6 is a circuit timing sequence diagram of the shift register unit in FIG. 4.

FIG. 6 is a circuit timing sequence diagram of the shift register unit as illustrated in FIG. 4. In FIG. 6, the second level is a low level, and the first level is a high level. As illustrated in FIG. 6, the operating principle of the shift register unit as illustrated in FIG. 4 mainly includes the following operating stages.

Figure 7:
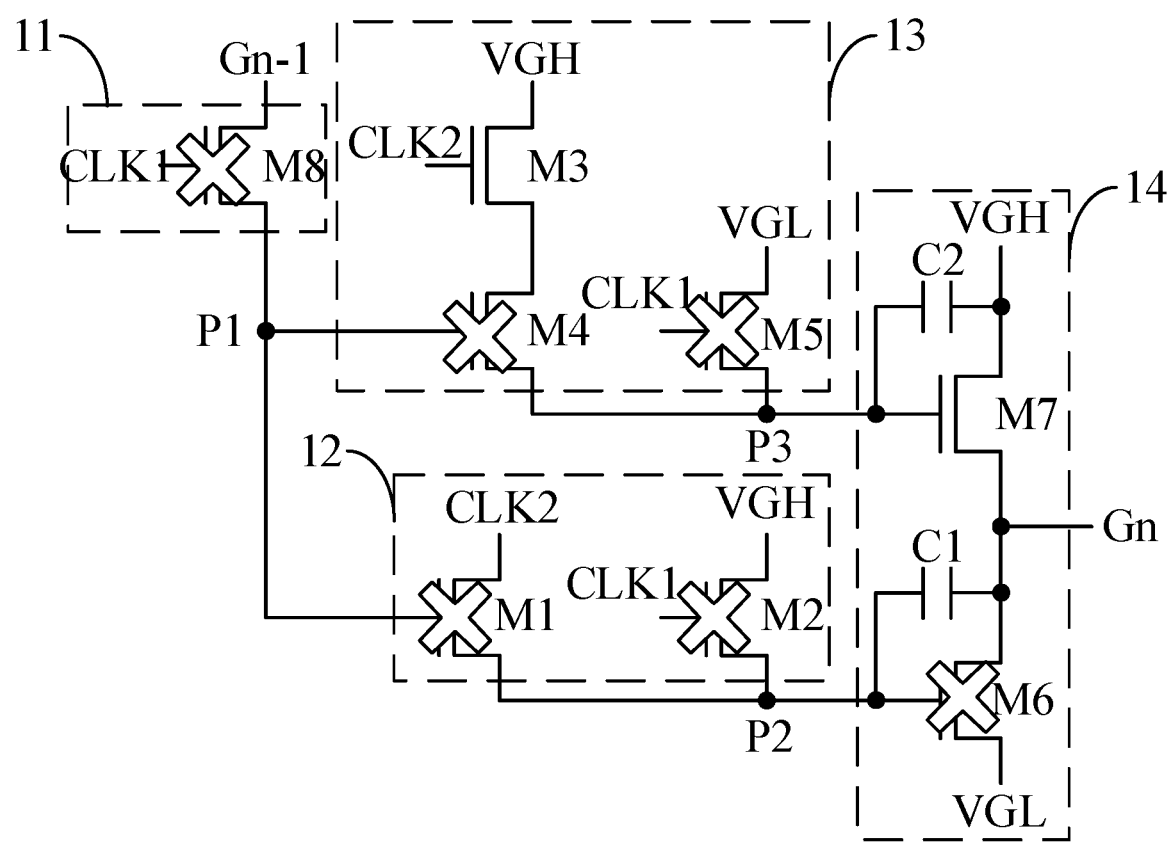
FIG. 7 is a schematic diagram illustrating state of the shift register unit in FIG. 4 at an operating stage.

At a first operating stage (that is, the noise-reduction stage in the above embodiment), prior to a first moment t1, the first clock signal CK1 and the second clock signal CK2 are subjected to level inversion according to the same clock cycle, and a time period during which the input terminal Gn-1 is at the low level does not coincide with a time period during which the first clock signal CK1 is at the low level. At the first operating stage, the on-off states of the transistors are as illustrated in FIG. 7. The eighth transistor M8 is in an off state all the time, and the first node P1 remains at the high level. Under the effect of the first node P1, the first transistor M1 and the fourth transistor M4 are in an off state all the time. The second node P2 remains at the high level under the effect of the second transistor M2 that is cyclically turned on. The third node P3 remains at the low level under the effect of the fifth transistor M5 that is cyclically turned on. The sixth transistor M6 remains in an off state under the effect of the second node P2. The seventh transistor M7 remains in an on state under the effect of the third node P3. The first level voltage line VGH provides a high level for the output terminal Gn by the seventh transistor M7, such that the output terminal Gn remains at the high level. When the second clock signal is at the second level, the third transistor M3 is turned on.

Figure 8:
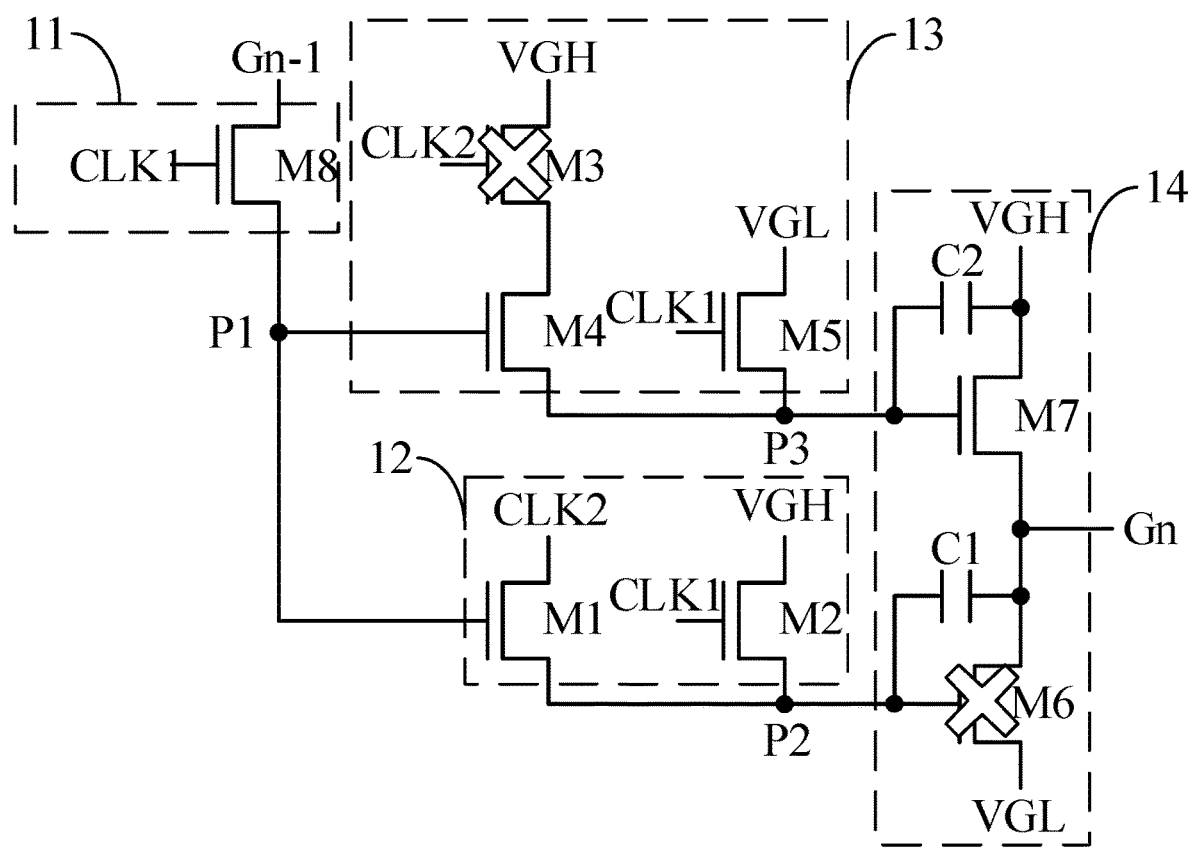
FIG. 8 is a schematic diagram illustrating state of the shift register unit in FIG. 4 at another operating stage.

At a second operating stage (that is, the charging stage in the above embodiment), between the first moment T1 and a second moment t2, the first clock signal CK1 is at the low level, and the second clock signal CK2 is at the high level, and the input signal from the input terminal Gn-1 is at the low level. At this moment, the on-off states of the transistors are as illustrated in FIG. 8. The eighth transistor M8 is turned on under the effect of the first clock signal CK1, such that the first node P1 is shifted to the low level. The first transistor M1 and the fourth transistor M4 are turned on under the effect of the first node P1. Meanwhile, under the effect of the first clock signal CK1, the second transistor M2 and the fifth transistor M5 are turned on. Under the effect of the second clock signal CK2, the third transistor M3 is turned off. At this moment, the second clock signal CK2 and the first level voltage line VGH provide signals for the second node P2, such that the second node P2 is at the high level. The third node P3 is communicated with the second level voltage line VGL, such that the third node P3 is at the low level. Under the effect of the second node P2, the sixth transistor M6 is turned off. Under the effect of the third node P3, the seventh transistor M7 is turned on. The first level voltage line VGH provides a high level for the output terminal Gn by the seventh transistor M7, such that the output terminal Gn still remains at the high level. In addition, at this stage, levels at both terminals of the first capacitor C1 are equal.

At a third operating stage, between the second moment t2 and a third moment t3, the input signal from the input terminal Gn-1 is shifted to the high level, and the first clock signal CK1 and the second clock signal CK2 are both at the high level. Under the effect of the first clock signal CK1, the eighth transistor M8, the second transistor M2 and the fifth transistor M5 are all turned off. In addition, under the effect of the second clock signal CK2, the third transistor M3 remains at an off state. In this way, the first node P1, the second node P2 and the third node P3 all remain at their original levels. That is, the first node P1 remains at the low level, the second node P2 remains at the high level, and the third node P3 remains at the low level. The seventh transistor M7 is turned on under the effect of the third node P3. The first level voltage line VGH provides a high level for the output terminal Gn by the seventh transistor M7, such that the output terminal Gn remains at the high level. The third operating stage may be considered as a transition stage between the charging stage and the outputting stage.

Figure 9:
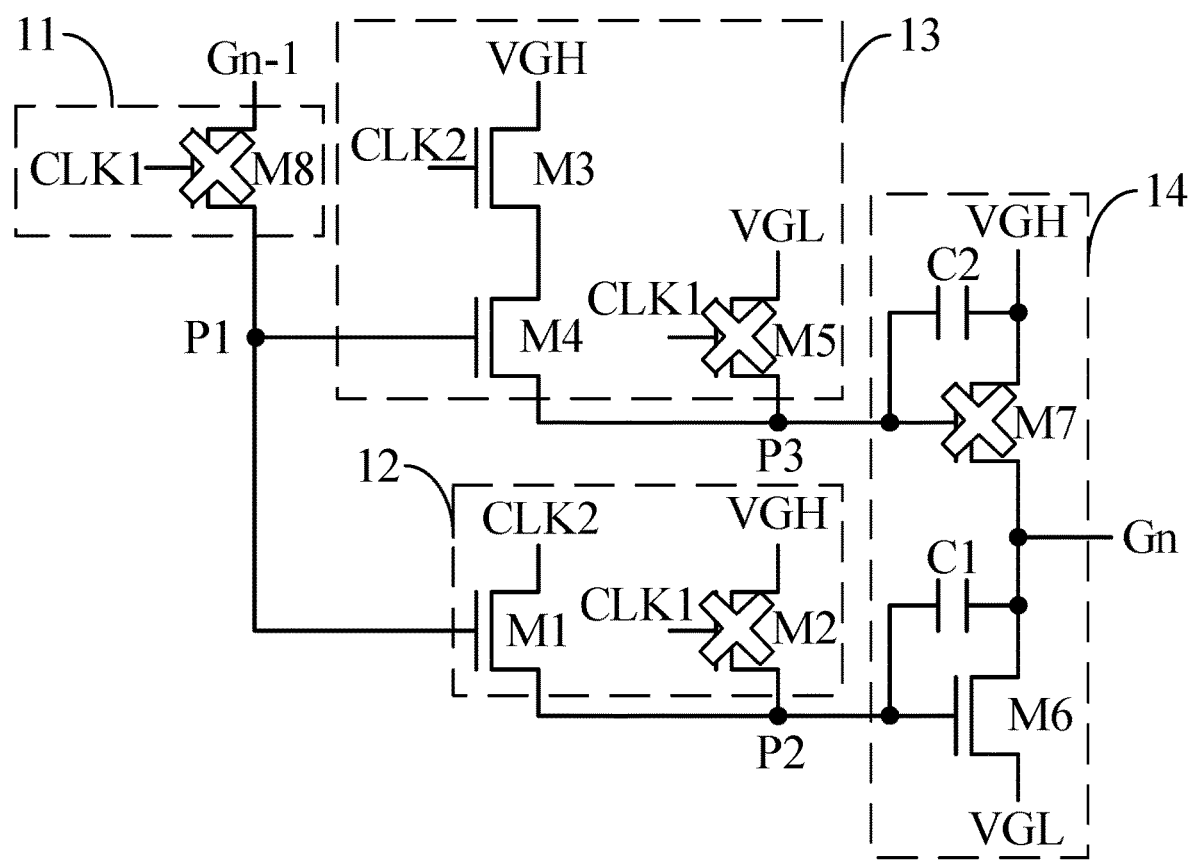
FIG. 9 is a schematic diagram illustrating state of the shift register unit in FIG. 4 at still another operating stage.

At a fourth operating stage (that is, the outputting stage in the above embodiment), between the third moment t3 and a fourth moment t4, the input signal from the input terminal Gn-1 is at the high level, the first clock signal CK1 is at the high level, the second clock signal is at the low level, and the first node P1 remains at the low level. At this moment, the on-off states of the transistors are as illustrated in FIG. 9. Under the effect of the first clock signal CK1, the eighth transistor M8, the second transistor M2 and the fifth transistor M5 remains in an off state. Under the effect of the first node P1, the first transistor M1 and the fourth transistor M4 remain in an on state. In addition, under the effect of the second clock signal CK2, the third transistor M3 is turned on. The first level voltage line VGH provides a high level for the third node P3 by the third transistor M3 and the fourth transistor M4, such that the third node P3 is shifted to the high level. The second clock signal CK2 provides a low level for the second node P2 by the first transistor M1, such that the second node P2 is shifted to the low level. The sixth transistor M6 is turned on under the effect of the second node P2, and the seventh transistor M7 is turned off under the effect of the third node P3, such that the on-off states of the sixth transistor M6 and the seventh transistor M7 are inverted relative to the on-off states thereof at the third operating stage. The second level voltage line VGL provides a low level for the output terminal Gn by the sixth transistor M6, such that the output terminal Gn outputs the low level. In this case, the output terminal Gn outputs a drive signal for driving pixel units in a display panel.

In addition, during this process, under the charge maintaining effect of the first capacitor C1, when a potential of the second node P2 at one terminal of the capacitor C1 decreases, a potential of the output terminal Gn at the other terminal of the capacitor C1 decreases accordingly. In this way, it is ensured that the potential of the output terminal Gn can be pulled down under the charge maintaining effect, and the speed of level change increases and the changing duration is shorter relative to the implementation of pulling down the potential of the output terminal Gn by virtue of source and drain currents of the sixth transistor M6.

At a fifth operating stage, between the fourth moment t4 and a fifth moment t5, the first clock signal CK1 and the second clock signal CK2 are both at the high level. The eighth transistor M8, the second transistor M2, the fifth transistor M5 and the third transistor M3 are turned off. The first node P1, the second node P2 and the third node P3 all remains at the original levels thereof. The sixth transistor M6 is turned on under the effect of the second node P2 at the low level. The second level voltage line VGL provides a low level for the output terminal Gn by the sixth transistor M6, such that the output terminal Gn outputs the low level. The fifth operating stage may be considered as a transition stage between the outputting stage and the resetting stage.

Figure 10:
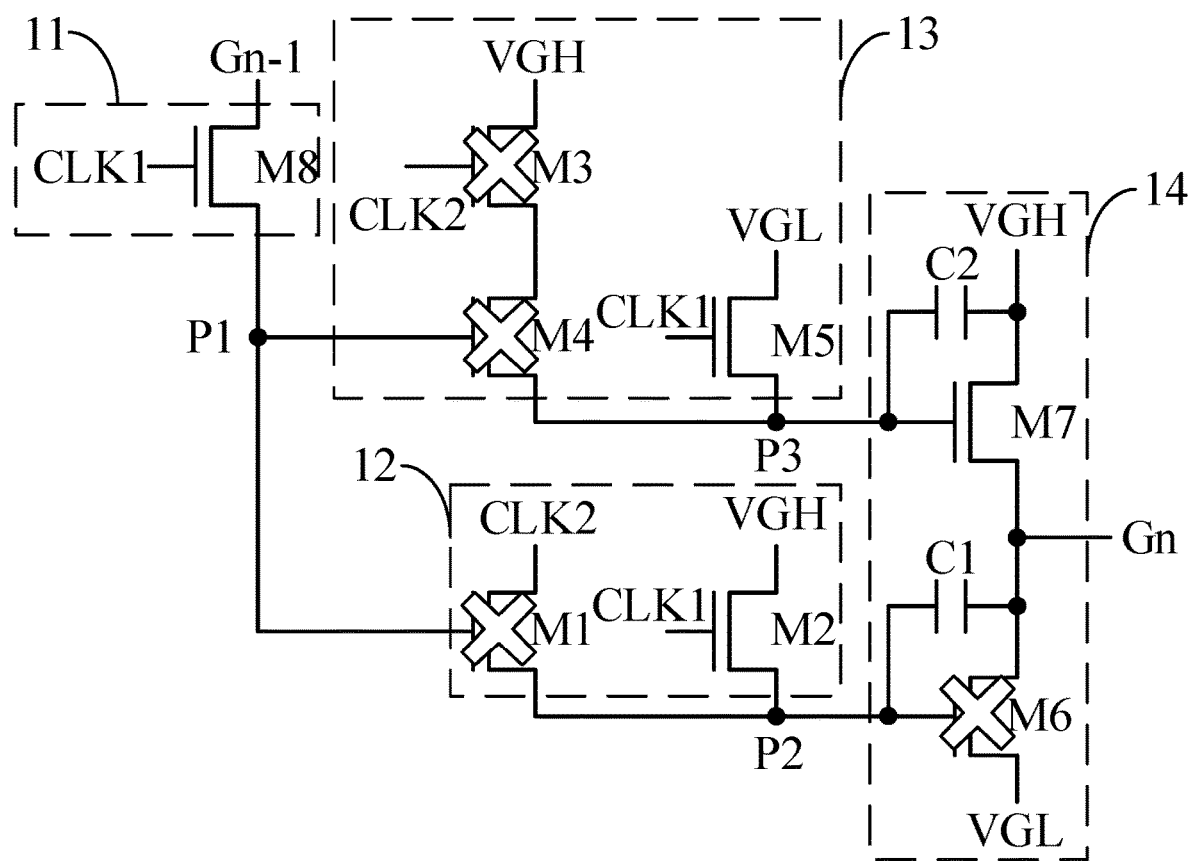
FIG. 10 is a schematic diagram illustrating state of the shift register unit in FIG. 4 at yet still another operating stage.

At a sixth operating stage (that is, the resetting stage in the above embodiment), between the fifth moment t5 and a sixth moment t6, the first clock signal CK1 is at the low level. At this moment, the second clock signal CK2 and the output terminal Gn-1 are both at the high level. In this case, the on-off states of the transistors are as illustrated in FIG. 10. Under the effect of the second clock signal CK2, the third transistor M3 remains in an off state. Under the effect of the first clock signal CK1, the second transistor M2, the fifth transistor M5 and the eighth transistor M8 are all turned on. The first node P1 is communicated with the input terminal Gn-1, such that the first node P1 is shifted to the high level. Under the effect of the first node P1, the first transistor M1 and the fourth transistor M4 are turned off. The first level voltage line VGH provides a high level for the second node P2 by the second transistor M2, such that the second node P2 is shifted to the high level. The second level voltage line VGL provides a low level for the third node P3 by the fifth transistor M5, such that the third node P3 is shifted to the low level. The sixth transistor M6 is turned off under the effect of the second node P2, and the seventh transistor M7 is turned on under the effect of the third node P3. The first level voltage line VGH provides a high level for the output terminal Gn by the seventh transistor M7, such that the output terminal Gn outputs the high level. Afterwards, the shift register unit resumes to the state prior to the first moment t1 (that is, the first operating stage), and the output terminal Gn remains at the high level until a next second operating stage starts.

It should be understood that exemplary implementations of the above driving method are included in the above descriptions. It should be further understood that the signal at the input terminal Gn-1 for the implementing the above operating processes is not limited to the form as illustrated in FIG. 6. Since the signal at the input terminal Gn-1 does not affect the operating state of the shift register unit when the first clock signal CK1 is at the high level, within the time period during which the first clock signal CK1 is at the high level, the level of the signal at the input terminal Gn-1 may not be limited. In addition, as seen from the above operating processes, in the case that the first clock signal CK1 and the input terminal Gn-1 are both at the low level, output of the low level at the output terminal Gn may be started when the second clock signal CK2 is subjected to level inversion, and output of the low level at the output terminal Gn may be stopped when a subsequent initial first clock signal CK1 is at the low level and the input terminal Gn-1 is at the high level. Therefore, providing the low level for the input terminal Gn-1 may be started within the time period during which the initial first clock signal CK1 is at the low level before the time period during which the low level is expected to be output at the output terminal Gn; and providing the low level for the input terminal Gn-1 may be stopped, and providing the high level for the input terminal Gn-1 may be started within the time period during which the initial first clock signal CK1 is at the low level after the time period during which the low level is expected to be output at the output terminal Gn. In this way, desired outputs may be achieved.

In an example, on the basis of the diagram in FIG. 6, by adjusting the falling edge of the input signal at the input terminal Gn-1 to the first moment t1, and adjusting the rising edge of the input signal to the third moment t3, it can be ensured that the waveform at the output terminal Gn remains unchanged. In this case, the output signal at the output terminal Gn is delayed by a fixed duration (which is equal to the time length between the first moment t1 and the third moment t3) relative to the input signal at the input terminal Gn-1, and the duration during which the output signal is at the second level is the same as the duration during which the input signal is at the second level. Therefore, the output signal may be taken as another signal at the input terminal of the shift register unit as illustrated in FIG. 4. The first clock signal used by the shift register unit is the second clock signal CK2 as illustrated in FIG. 6, and the second clock signal used by the shift register unit is the first clock signal CK1 as illustrated in FIG. 6, such that the shift register unit may output, according to the above operating process, a signal that is delayed by the above fixed duration relative to the output signal as illustrated in FIG. 6.

Further, another embodiment of the present disclosure provides a scan drive circuit including at least one of shifter register units as described above. Since each shift register unit in the scan drive circuit may be formed by eight transistors, the number of transistors needed by the scan drive circuit may be reduced, the space occupied by the GOA units may be reduced, and thus the frame is narrowed.

The scan drive circuit may be formed by cascading a plurality of shift register units stage by stage. A first shifter unit and a second shift register unit (the first shift register is at a previous stage of the second shift register unit) that are at any two adjacent stages may be connected in the following fashion: an output terminal of the first shift register unit is connected to an input terminal of the second shift register unit, a first clock terminal (a terminal configured to be connected to the first clock signal terminal) is connected to a second clock terminal (a terminal configured to be connected to the second clock signal terminal) of the second shift register unit, and a second clock terminal of the first shift register unit is connected to a first clock terminal of the second shift register unit. A signal at the input terminal of the first stage of shift register unit in the several stages of the shift register units may be set according to the above description.

Figure 11:
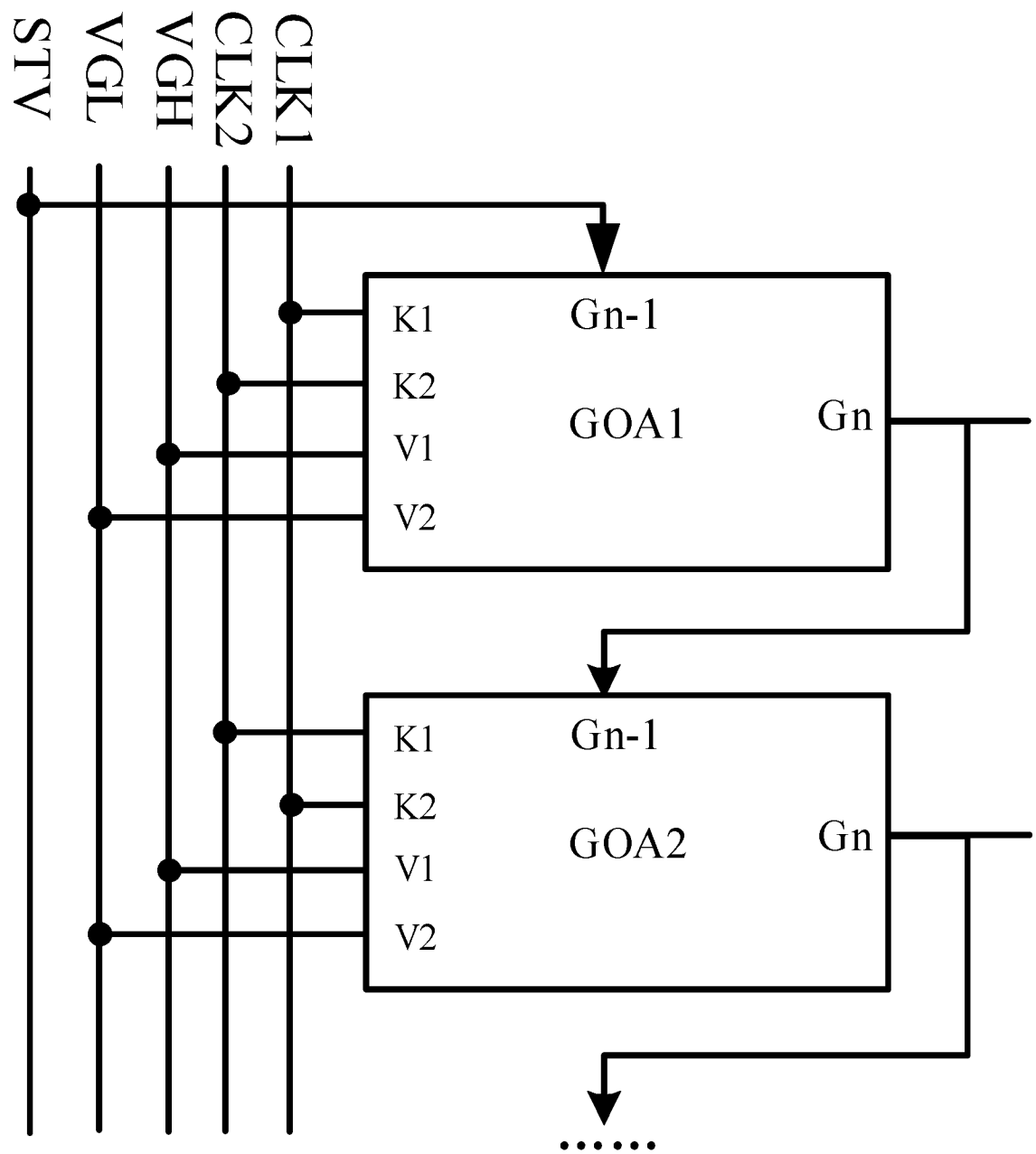
FIG. 11 is a schematic diagram of part of a scan drive circuit according to embodiments of the present disclosure.

Exemplarily, FIG. 11 is a schematic diagram of part of a scan drive circuit according to an embodiment of the present disclosure. As illustrated in FIG. 11, the scan drive circuit includes a shift register unit GOA1 and a shift register unit GOA2 that are cascaded. Each shift register unit may be the shift register unit as illustrated in any one of FIG. 1 to FIG. 4. As illustrated in FIG. 11, each shift register unit includes an input terminal Gn-1, an output terminal Gn, a first clock terminal K1, a second clock terminal K2, a first power source terminal V1 and a second power source terminal V2. The first power source terminals V1 of the shift register unit GOA1 and the shift register unit GOA2 are both connected to the first level voltage line VGH, and the second power source terminals V2 of the shift register unit GOA1 and the shift register unit GOA2 are both connected to the second level voltage line VGL. The input terminal Gn-1 of the shift register unit GOA1 is connected to a start signal terminal STV, and the output terminal of the shift register unit GOA1 is connected to the input terminal Gn-1 of the shift register unit GOA2. In addition, the first clock terminal K1 of the shifter register GOA1 and the second clock terminal K2 of the shift register unit GOA2 are both connected to the first clock signal terminal CLK1, and the second clock terminal K2 of the shift register unit GOA1 and the first clock terminal K1 of the shift register unit GOA2 are both connected to the second clock signal terminal CLK2. The scan drive circuit according to the embodiment of the present disclosure may repeatedly employ the above connection with two shift register units as a unit.

Based on the same inventive concept, still yet another embodiment of the present disclosure provides a display apparatus. The display apparatus includes any of the scan drive circuits as described above. The display apparatus according to the embodiment of the present disclosure may be a display panel, a mobile phone, a tablet computer, a television, a display, a laptop computer, a digital photo frame, a navigator or the like product or part having the display function.

Figure 12:
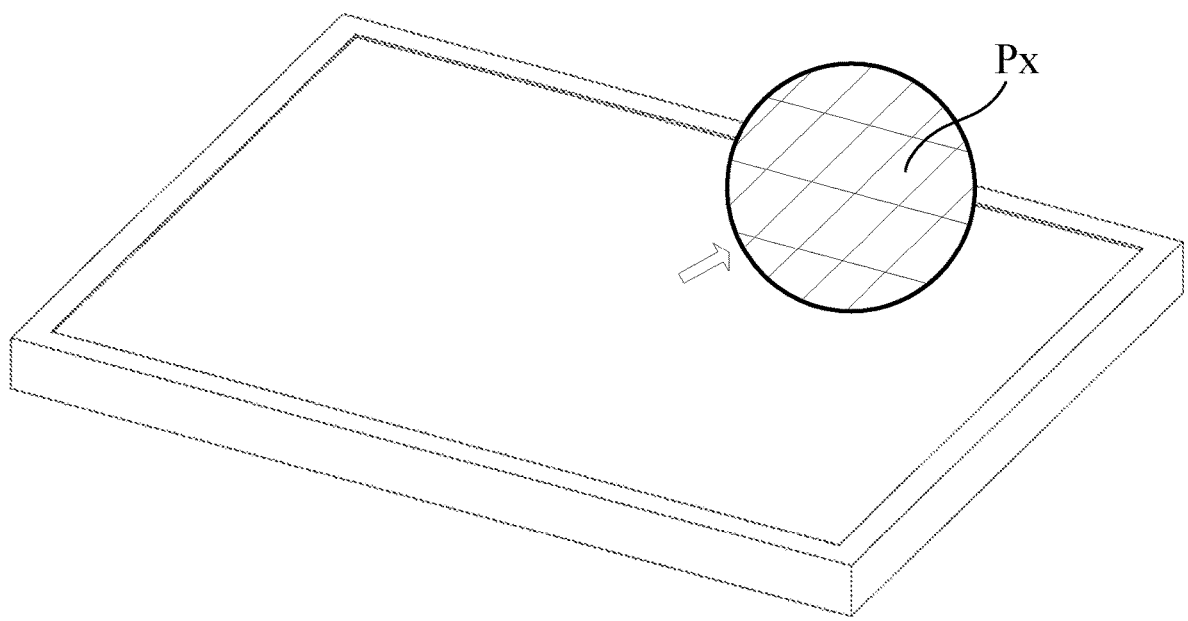
FIG. 12 is a schematic structural diagram of a display apparatus according to embodiments of the present disclosure.

FIG. 12 is a schematic structural diagram of a display apparatus according to embodiments of the present disclosure. Referring to FIG. 12, the display apparatus includes a plurality of sub-pixels Px in a display region. A gate drive signal for driving a row of sub-pixels Px may be provided by the above shift register unit. It can be understood that the display apparatus according to the embodiment of the present disclosure may include fewer transistors, and thus has a narrower frame.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the appended claims of the present disclosure.

What is claimed is:

1. A shift register unit, comprising an input terminal and an output terminal, and further comprising: an input circuit, an output control circuit, a reset control circuit and an output circuit; wherein the input circuit is connected to a first clock signal terminal, the input terminal and a first node, and configured to provide an input signal from the input terminal for the first node when a first clock signal from the first clock signal terminal is at a second level;

the output control circuit is connected to the first clock signal terminal, a second clock signal terminal, a first level voltage line, the first node and a second node, and configured to provide a second clock signal from the second clock signal terminal for the second node when the first node is at the second level, and provide a first level from the first level voltage line for the second node when the first clock signal is at the second level;

the reset control circuit is connected to the first clock signal terminal, the second clock signal terminal, the first level voltage line, a second level voltage line, the first node and a third node, and configured to provide the first level from the first level voltage line for the third node when the second clock signal and the first node are both at the second level, and provide a second level from the second level voltage line for the third node when the first clock signal is at the second level; and the output circuit is connected to the first level voltage line, the second level voltage line, the second node, the third node and the output terminal, and configured to provide the second level from the second level voltage line for the output terminal when the second node is at the second level, and provide the first level from the first level voltage line for the output terminal when the third node is at the second level.

2. The shift register unit according to claim 1, wherein the output control circuit comprises: a first output control sub-circuit and a second output control sub-circuit; wherein the first output control sub-circuit is connected to the first node, the second clock signal terminal and the second node, and configured to provide the second clock signal for the second node when the first node is at the second level; and the second output control sub-circuit is connected to the first clock signal terminal, the first level voltage line and the second node, and configured to provide the first level from the first level voltage line for the second node when the first clock signal is at the second level.

3. The shift register unit according to claim 2, wherein the first output control sub-circuit comprises a first transistor; and the second output control sub-circuit comprises a second transistor; wherein a gate of the first transistor is connected to the first node, one of a source and a drain of the first transistor is connected to the second clock signal terminal, and the other of the source and the drain of the first transistor is connected to the second node; and a gate of the second transistor is connected to the first clock signal terminal, one of a source and a drain of the second transistor is connected to the first level voltage line, and the other of the source and the drain of the second transistor is connected to the second node.

4. The shift register unit according to claim 2, wherein the first reset control sub-circuit comprises a third transistor and a fourth transistor; and the second reset control sub-circuit comprises a fifth transistor; wherein a gate of the third transistor is connected to the second clock signal terminal, one of a source and a drain of the third transistor is connected to the first level voltage line, and the other of the source and the drain of the third transistor is connected to a source or a drain of the fourth transistor;

a gate of the fourth transistor is connected to the first node, one of the source and the drain of the fourth transistor that is not connected to the third transistor is connected to the third node; and a gate of the fifth transistor is connected to the first clock signal terminal, one of a source and a drain of the fifth transistor is connected to the second level voltage line, and the other of the source and the drain of the fifth transistor is connected to the third node.

5. The shift register unit according to claim 1, wherein the reset control circuit comprises: a first reset control sub-circuit and a second reset control sub-circuit; wherein the first reset control sub-circuit is connected to the first node, the second clock signal terminal, the first level voltage line and the third node, and configured to provide the first level from the first level voltage line for the third node when the second clock signal and the first node are both at the second level; and the second reset control sub-circuit is connected to the first clock signal terminal, the second level voltage line and the third node, and configured to provide the second level from the second level voltage line for the third node when the first clock signal is at the second level.

6. The shift register unit according to claim 1, wherein the output circuit comprises: a first output sub-circuit and a second output sub-circuit; wherein the first output sub-circuit is connected to the second node, the second level voltage line and the output terminal, and configured to provide the second level from the second level voltage line for the output terminal when the second node is at the second level; and the second output sub-circuit is connected to the third node, the first level voltage line and the output terminal, and configured to provide the first level from the first level voltage line for the output terminal when the third node is at the second level.

7. The shift register unit according to claim 6, wherein the first output sub-circuit comprises a sixth transistor; and the second output sub-circuit comprises a seventh transistor; wherein a gate of the sixth transistor is connected to the second node, one of a source and a drain of the sixth transistor is connected to the output terminal, and the other of the source and the drain of the sixth transistor is connected to the second level voltage line; and a gate of the seventh transistor is connected to the third node, one of a source and a drain of the seventh transistor is connected to the first level voltage line, and the other of the source and the drain of the seventh transistor is connected to the output terminal.

8. The shift register unit according to claim 7, wherein the first output sub-circuit further comprises: a first capacitor; wherein a first terminal of the first capacitor is connected to the second node, and a second terminal of the first capacitor is connected to the output terminal.

9. The shift register unit according to claim 7, wherein the second output sub-circuit further comprises: a second capacitor; wherein a first terminal of the second capacitor is connected to the third node, and a second terminal of the second capacitor is connected to the first level voltage line.

10. The shift register unit according to claim 1, wherein the input circuit comprises: an eighth transistor;

wherein a gate of the eighth transistor is connected to the first clock signal terminal, one of a source and a drain of the eighth transistor is connected to the input terminal, and the other of the source and the drain of the eighth transistor is connected to the first node.

11. The shift register unit according to claim 1, wherein the output control circuit comprises a first transistor and a second transistor; the reset control circuit comprises a third transistor, a fourth transistor and a fifth transistor; the output circuit comprises a sixth transistor and a seventh transistor; and the input circuit comprises an eighth transistor; wherein a gate of the first transistor is connected to the first node, one of a source and a drain of the first transistor is connected to the second clock signal terminal, and the other of the source and the drain of the first transistor is connected to the second node;

a gate of the second transistor is connected to the first clock signal terminal, one of a source and a drain of the second transistor is connected to the first level voltage line, and the other of the source and the drain of the second transistor is connected to the second node;

a gate of the third transistor is connected to the second clock signal terminal, one of a source and a drain of the third transistor is connected to the first level voltage line, and the other of the source and the drain of the third transistor is connected to a source or a drain of the fourth transistor;

a gate of the fourth transistor is connected to the first node, one of the source and the drain of the fourth transistor is connected to the source or the drain of the third transistor, and the other of the source and the drain of the fourth transistor is connected to the third node;

a gate of the fifth transistor is connected to the first clock signal terminal, one of a source and a drain of the fifth transistor is connected to the second level voltage line, and the other of the source and the drain of the fifth transistor is connected to the third node;

a gate of the sixth transistor is connected to the second node, one of a source and a drain of the sixth transistor is connected to the output terminal, and the other of the source and the drain of the sixth transistor is connected to the second level voltage line;

a gate of the seventh transistor is connected to the third node, one of a source and a drain of the seventh transistor is connected to the first level voltage line, and the other of the source and the drain of the seventh transistor is connected to the output terminal; and a gate of the eighth transistor is connected to the first clock signal terminal, one of a source and a drain of the eighth transistor is connected to the input terminal, and the other of the source and the drain of the eighth transistor is connected to the first node.

12. The shift register unit according to claim 11, wherein the output circuit further comprises: a first capacitor and a second capacitor; wherein a first terminal of the first capacitor is connected to the second node, and a second terminal of the first capacitor is connected to the output terminal; and a first terminal of the second capacitor is connected to the third node, and a second terminal of the second capacitor is connected to the first level voltage line.

13. The shift register unit according to claim 1, wherein the second level is lower than the first level, and transistors in the shift register unit are all P-type metal-oxide semiconductor field-effect transistors based on low-temperature polycrystalline silicon.

14. A scan drive circuit, comprising at least one shift register unit, the shift register unit comprising an input terminal and an output terminal, and further comprising an input circuit, an output control circuit, a reset control circuit and an output circuit; wherein the input circuit is connected to a first clock signal terminal, the input terminal and a first node, and configured to provide an input signal from the input terminal for the first node when a first clock signal from the first clock signal terminal is at a second level;

the output control circuit is connected to the first clock signal terminal, a second clock signal terminal, a first level voltage line, the first node and a second node, and configured to provide a second clock signal from the second clock signal terminal for the second node when the first node is at the second level, and provide a first level from the first level voltage line for the second node when the first clock signal is at the second level;

the reset control circuit is connected to the first clock signal terminal, the second clock signal terminal, the first level voltage line, a second level voltage line, the first node and a third node, and configured to provide the first level from the first level voltage line for the third node when the second clock signal and the first node are both at the second level, and provide a second level from the second level voltage line for the third node when the first clock signal is at the second level; and the output circuit is connected to the first level voltage line, the second level voltage line, the second node, the third node and the output terminal, and configured to provide the second level from the second level voltage line for the output terminal when the second node is at the second level, and provide the first level from the first level voltage line for the output terminal when the third node is at the second level.

15. A display apparatus, comprising the scan drive circuit according to claim 14.

16. A method for driving a shift register unit, wherein the method is for driving a shift register unit, the method comprising:

at a charging stage, during which a first clock signal is at a second level, a second clock signal is at a first level, providing the second level for an input terminal of the shift register unit;

wherein the shift register unit comprises an input terminal and an output terminal, and further comprises an input circuit, an output control circuit, a reset control circuit and an output circuit; wherein the input circuit is connected to a first clock signal terminal, the input terminal and a first node, and configured to provide an input signal from the input terminal for the first node when a first clock signal from the first clock signal terminal is at the second level;

the output control circuit is connected to the first clock signal terminal, a second clock signal terminal, a first level voltage line, the first node and a second node, and configured to provide a second clock signal from the second clock signal terminal for the second node when the first node is at the second level, and provide a first level from the first level voltage line for the second node when the first clock signal is at the second level;

the reset control circuit is connected to the first clock signal terminal, the second clock signal terminal, the first level voltage line, a second level voltage line, the first node and a third node, and configured to provide the first level from the first level voltage line for the third node when the second clock signal and the first node are both at the second level, and provide a second level from the second level voltage line for the third node when the first clock signal is at the second level; and the output circuit is connected to the first level voltage line, the second level voltage line, the second node, the third node and the output terminal, and configured to provide the second level from the second level voltage line for the output terminal when the second node is at the second level, and provide the first level from the first level voltage line for the output terminal when the third node is at the second level.

17. The method according to claim 16, wherein at the charging stage, the input circuit provides the input signal for the first node under control of the first clock signal.

18. The method according to claim 16, wherein after the charging stage, the method further comprises:

at an outputting stage, during which the second clock signal is at the second level and the first clock signal is at the first level, providing the first level for the input terminal, the first node is at the second level, providing, by an output control circuit, the second clock signal for the second node under control of the first node, and providing, by the output circuit, the second level from the second level voltage line for the output terminal under control of the second node; and at a resetting stage, during which the first clock signal is at the second level and the second clock signal is at the first level, providing the first level for the input terminal, providing, by the reset control circuit, the second level from the second level voltage line for the third node under control of the first clock signal, providing, by the output circuit, the first level from the first level voltage line for the output terminal under control of the third node, and providing, by the output control circuit, the first level from the first level voltage line for the second node under control of the first clock signal.

19. The method according to claim 18, wherein at the outputting stage, the reset control circuit provides the first level from the first level voltage line for the third node under control of the second clock signal and the first node.

20. The method according to claim 16, wherein prior to the charging stage, the method further comprises:

at a noise-reduction stage, during which the first clock signal and the second clock signal are subjected to level inversion according to an identical clock cycle, providing the first level for the input terminal, wherein the first node remains at the first level, the second node remains at the first level, and the third node remains at the second level, and providing, by the output circuit, the first level from the first level voltage line for the output terminal under control of the third node.

* * * * *